US011949216B2

(12) United States Patent
Favreau et al.

(10) Patent No.: US 11,949,216 B2
(45) Date of Patent: Apr. 2, 2024

(54) ELECTROMECHANICAL ASSEMBLY HAVING INTEGRATED CONDUCTOR

(71) Applicant: Raytheon Company, Waltham, MA (US)

(72) Inventors: Channing P. Favreau, Barre, MA (US); Alexander Gilbert, Boston, MA (US); Thomas V. Sikina, Acton, MA (US)

(73) Assignee: Raytheon Company, Tewksbury, MA (US)

( * ) Notice: Subject to any disclaimer, the term of this patent is extended or adjusted under 35 U.S.C. 154(b) by 78 days.

(21) Appl. No.: 17/658,344

(22) Filed: Apr. 7, 2022

(65) Prior Publication Data

US 2023/0231371 A1   Jul. 20, 2023

Related U.S. Application Data

(60) Provisional application No. 63/300,389, filed on Jan. 18, 2022.

(51) Int. Cl.
    *H02G 15/10* (2006.01)
    *H05K 5/02* (2006.01)

(52) U.S. Cl.
    CPC .......... *H02G 15/10* (2013.01); *H05K 5/0247* (2013.01)

(58) Field of Classification Search
    None
    See application file for complete search history.

(56) References Cited

U.S. PATENT DOCUMENTS

| | | | | |
|---|---|---|---|---|
| 4,707,563 A * | 11/1987 | Conrad | ............... | H05K 5/0247 439/716 |
| 5,870,064 A | 2/1999 | Kaegebein | | |
| 6,071,127 A | 6/2000 | Acke et al. | | |
| 6,791,841 B1 * | 9/2004 | Tirrell | ................. | H05K 5/0247 361/725 |
| 7,038,625 B1 * | 5/2006 | Taylor | ............... | H01Q 21/0093 343/700 MS |
| 7,488,202 B2 | 2/2009 | Spitaels et al. | | |
| 8,573,855 B2 | 11/2013 | Nhep | | |
| 8,882,514 B2 | 11/2014 | Enge et al. | | |
| 9,383,521 B2 * | 7/2016 | Dendas | ................. | G02B 6/4477 |
| 10,444,462 B2 | 10/2019 | Wang et al. | | |

(Continued)

FOREIGN PATENT DOCUMENTS

| | | |
|---|---|---|
| EP | 2266845 A1 | 12/2010 |
| EP | 1 849 211 B1 | 4/2012 |

OTHER PUBLICATIONS

PCT International Search Report and Written Opinion dated Mar. 23, 2023 for International Application No. PCT/US2022/051132; 18 Pages.

(Continued)

*Primary Examiner* — Xanthia C Relford
(74) *Attorney, Agent, or Firm* — DALY, CROWLEY, MOFFORD & DURKEE, LLP

(57) ABSTRACT

Methods and apparatus for a housing assembly including a housing comprising a conductive material, a conductor extending through the housing, and a dielectric material at least partially surrounding the conductor. Portions of the housing may surround the conductor such that the conductor, the dielectric, and the portions of the housing form a channel through the housing.

22 Claims, 9 Drawing Sheets

(56) References Cited

U.S. PATENT DOCUMENTS

| | | | |
|---|---|---|---|
| 2002/0050950 A1* | 5/2002 | Rawnick | H01Q 9/285 343/795 |
| 2015/0085319 A1* | 3/2015 | Ho | H01Q 1/24 358/1.15 |
| 2016/0091932 A1* | 3/2016 | Dighde | G06F 1/1656 156/349 |
| 2017/0169172 A1 | 6/2017 | Blair et al. | |
| 2018/0177064 A1* | 6/2018 | van Pol | G01N 29/02 |
| 2018/0337462 A1* | 11/2018 | Vollmer | H01Q 9/16 |
| 2019/0051960 A1 | 2/2019 | Karlsson | |
| 2020/0028242 A1 | 1/2020 | Brigham et al. | |
| 2020/0398488 A1* | 12/2020 | Davis | B29C 64/245 |
| 2021/0377490 A1* | 12/2021 | McNelley | H04N 7/144 |

OTHER PUBLICATIONS

Taiwan Office Action (with English Translation) dated Aug. 25, 2023 for Taiwan Application No. 111146891; 15 Pages.

Response (with English Translation) to Taiwan Office Action dated Aug. 25, 2023 for Taiwan Application No. 111146891; Response filed Oct. 3, 2023; 43 Pages.

Taiwan Allowance Decision (with English Translation) dated Dec. 1, 2023 for Taiwan Application No. 111146891; 3 Pages.

* cited by examiner

ELECTROMECHANICAL ASSEMBLY HAVING INTEGRATED CONDUCTOR

CROSS-REFERENCE TO RELATED APPLICATIONS

This application claims the benefit of U.S. Provisional Application No. 63/300,389 filed Jan. 18, 2022 under 35 U.S.C. § 119(e) which application is hereby incorporated herein by reference in its entirety.

BACKGROUND

As is known in the art, electromechanical assemblies require electrical interconnections. As assemblies shrink in size and increase in the level of integration, interconnections may become a limiting factor. A wide variety of interconnections and connectors can be used to provide desired signal paths. For example, in conventional systems, cables and connectors may be routed either free standing or tied down with cables ties.

SUMMARY

Example embodiments of the disclosure provide methods and apparatus for an electromechanical housing assembly having integrated cable channels, such as DC and RF cable channels. In some embodiments, the housing is 3D printed. In some embodiments, a conductive channel is used as an outer ground conductor for coaxial RF cables and shielding for DC/Logic Cables. Direct contact between the cable structure and the housing serves as a thermal connection to the housing for improved power handling. A wide variety of desired complex geometries can be realized to control cable length, phase, loss, etc., as well as to simplify assembly and reduce the likelihood of miswiring. In addition, embodiments of the disclosure can provide enabling technology for high frequency arrays that have a high interconnect density. In some embodiments, channels can serve as high performing coaxial transmission lines.

In one aspect, a housing assembly comprises: a housing comprising a conductive material; a conductor extending through the housing; a dielectric material at least partially surrounding the conductor, wherein portions of the housing surround the conductor such that the conductor, the dielectric, and the portions of the housing form a channel through the housing.

A housing assembly can further include one or more of the following features: the first channel comprises a coaxial transmission line, the housing is printed, the housing forms part of a conformal antenna array, a circuit board conformally mounted on the housing, the housing has a hemispherical shape, the housing has a cylindrical shape, the housing is grounded, the housing provides a thermal dissipation path, a path of the conductor through the housing is non-linear and selected to achieve a selected length for the conductor, a path of the conductor through the housing is non-linear and selected for phase performance, a path of the conductor through the housing is non-linear and selected for loss performance, the housing comprises a surface with a series of facets, respective circuit cards mounted on the facets, and respective channels are connected to the circuit cards, the housing further includes a structural member to increase thermal performance of the assembly, the housing further includes a structural member to increase structural strength of the housing, and/or an end of the conductor provides a through hole soldered interface to a circuit board.

In another aspect, a method comprises: employing a housing comprising a conductive material; employing a conductor extending through the housing; employing a dielectric material at least partially surrounding the conductor, wherein portions of the housing surround the conductor such that the conductor, the dielectric, and the portions of the housing form a channel through the housing.

A method can further include one or more of the following features: the first channel comprises a coaxial transmission line, the housing is printed, the housing forms part of a conformal antenna array, a circuit board conformally mounted on the housing, the housing has a hemispherical shape, the housing has a cylindrical shape, the housing is grounded, the housing provides a thermal dissipation path, a path of the conductor through the housing is non-linear and selected to achieve a selected length for the conductor, a path of the conductor through the housing is non-linear and selected for phase performance, a path of the conductor through the housing is non-linear and selected for loss performance, the housing comprises a surface with a series of facets, respective circuit cards mounted on the facets, and respective channels are connected to the circuit cards, the housing further includes a structural member to increase thermal performance of the assembly, the housing further includes a structural member to increase structural strength of the housing, and/or an end of the conductor provides a through hole soldered interface to a circuit board.

BRIEF DESCRIPTION OF THE DRAWINGS

The foregoing features of this disclosure, as well as the disclosure itself, may be more fully understood from the following description of the drawings in which.

DETAILED DESCRIPTION

Before describing example embodiments of the disclosure, some information is provided. Coaxial cables refer to a type of electrical cable having an inner conductor surrounded by a concentric conductive material that forms a shield separated from the inner conductor by a dielectric material. A protective sheath or jacket can form an outer layer for the coaxial cable. A coaxial cable can be considered a type of transmission line for propagating high-frequency electrical signals with relatively low loss. In coaxial cable configurations, the electromagnetic field corresponding to the propagated signal is only present in the space between the inner and outer conductors so that coaxial cables can be located near conductive objects and materials without power loss. Similarly, the outer conductor prevents external signals from interfering with signals carried by the center conductor. Normally, the outside of the shield is kept at ground potential and a signal carrying voltage is applied to the center conductor.

In general, the characteristic impedance of the coaxial cable corresponds to the dielectric constant of the insulating material and the size of the center and outer conductors. For applications in which the cable length is comparable to the wavelength of the signals transmitted, a uniform cable characteristic impedance minimizes signal loss. Source and load impedances may be selected to match cable impedance for preferred power transfer and standing wave characteristics.

It is understood that any suitable dielectric can be used to meet the needs of a particular application. Example dielectrics include solid and foam dielectric materials that may contain air or other gas to achieve desired operating characteristics. In some embodiments, the dielectric is air.

Coaxial cables have connectors at terminal ends to maintain the coaxial connection and provide the same impedance as the cable. Connectors are usually coated with high-conductivity metals.

Figure 1A:
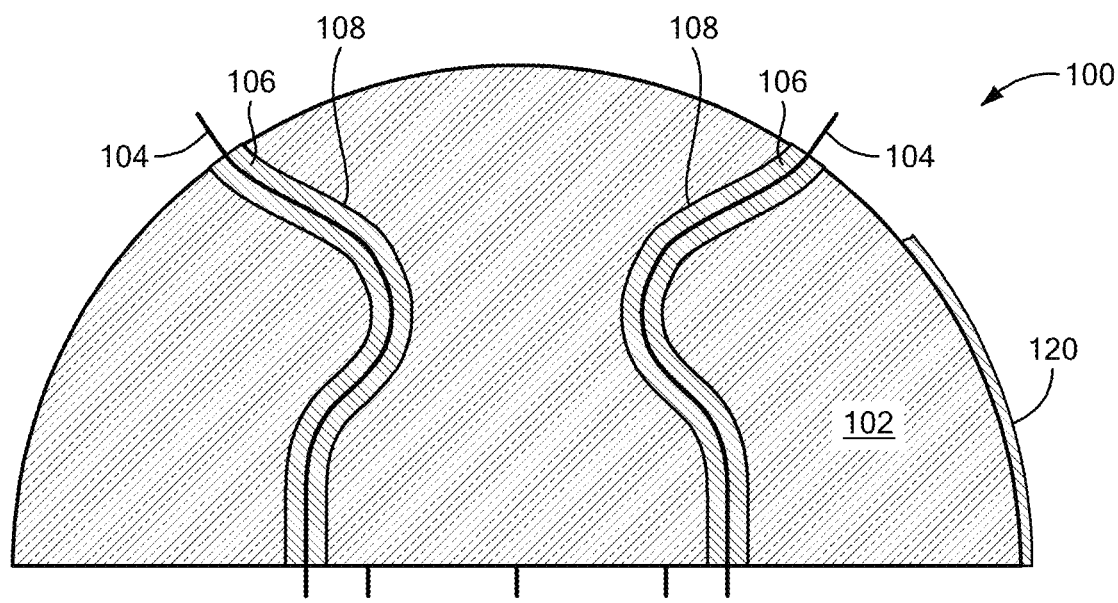
FIG. 1A is a partially cutaway side view.
Figure 1B:
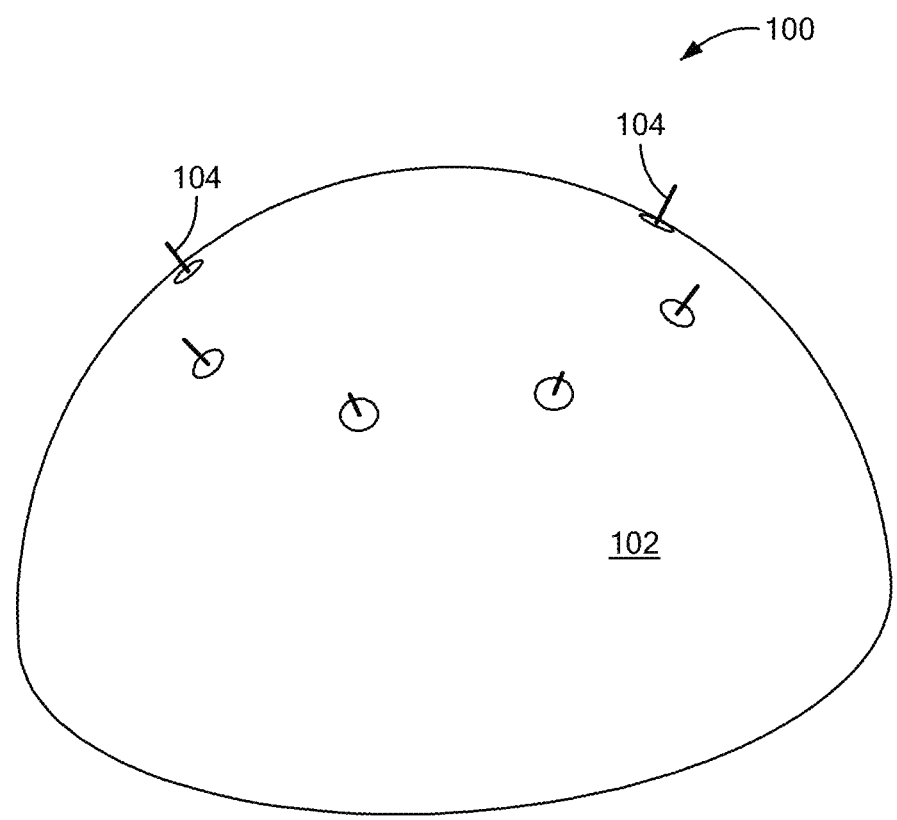
FIG. 1B is a first isometric view.

FIG. 1 shows an example assembly 100 including a conductive metal housing 102 and a conductor 104 at least partially contained within a dielectric material 106 to provide a low loss, high isolation interconnect. Example interconnects are configured for RF signals, DC signals, digital logic signals, and the like. In some embodiments, the conductor 104 is completely contained in the dielectric material 106. In other embodiments, the conductor 104 is not completely contained in the dielectric material. In some embodiments, a coaxial cable includes the conductor 104, the dielectric material 106, and a shield or outer conductor 108 provided by the conductive housing 102. In some embodiments, the conductor 104 is completely contained in the housing material 108. In other embodiments, the conductor 104 is not completely contained in the housing material 108.

In embodiments, the conductor 104, the dielectric 106, and the shield 108 provide a signal channel in a 3D printed housing. The use of 3D printing provides more degrees of freedom to form the housing than conventional assemblies for better performance.

With this arrangement, channels can be added to existing housings and cables can be fixed in place without the need for additional tie down points. Because the housing 102 is conductive, the housing can serve as the outer conductor for coaxial cables so as to reduce the overall size of the cables. In embodiments, a channel can serve as a high performing coaxial transmission line.

In embodiments, a conductor 104 is integrally formed in the housing 102 which provides a thermal path to dissipate heat generated in and around the conductor.

In an aspect of the disclosure, complex geometries can be realized to control cable length, phase, loss, and the like for respective channels to meet the needs of a particular application. In embodiments, a channel can serve to carry large numbers of signals as an enabler for high frequency and conformal arrays. In addition, example channel embodiments may reduce the likelihood of assembly miswirings.

Figure 1C:
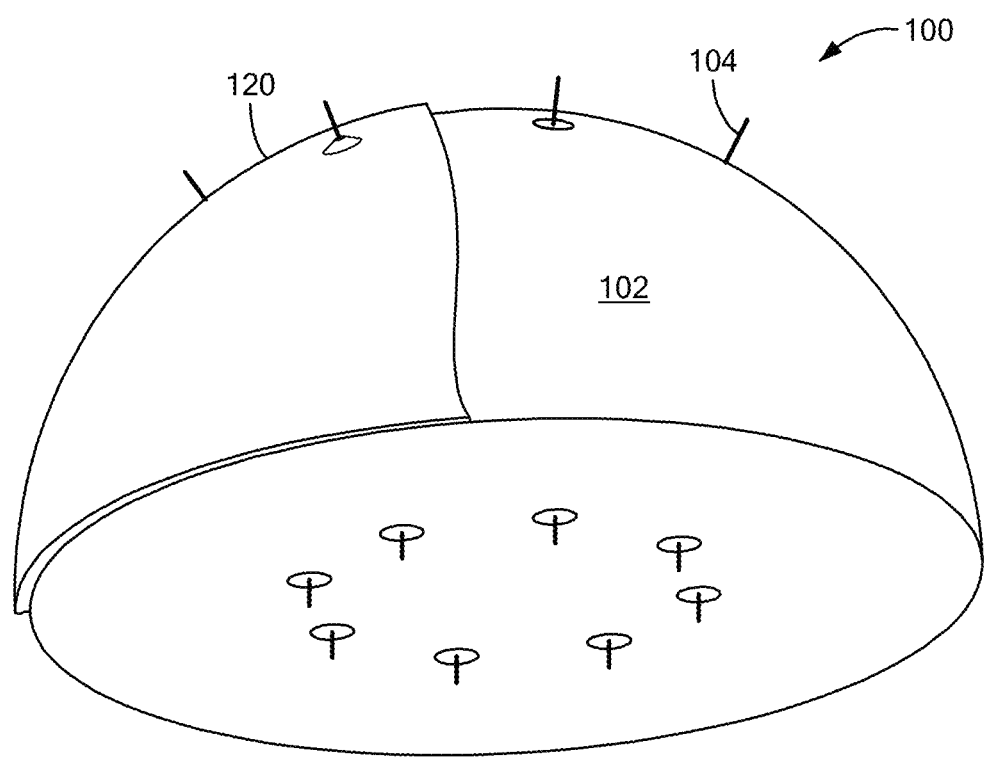
FIG. 1C is a second isometric view, of a housing assembly having an integrated cable.

As best seen in FIG. 1A, channels can include respective conductors 104 interconnected to a conformal antenna array 120, as shown in FIG. 1C. As used herein, conformal array refers to an array that conforms to the shape of a non-planar substrate. For example, a conformal array may conform to the outer surface of an airplane.

In embodiments, channels can match phase and loss better than with standard connectors and cables. Channels can be optimized to specific lengths and shapes for desired performance.

Figure 2A:
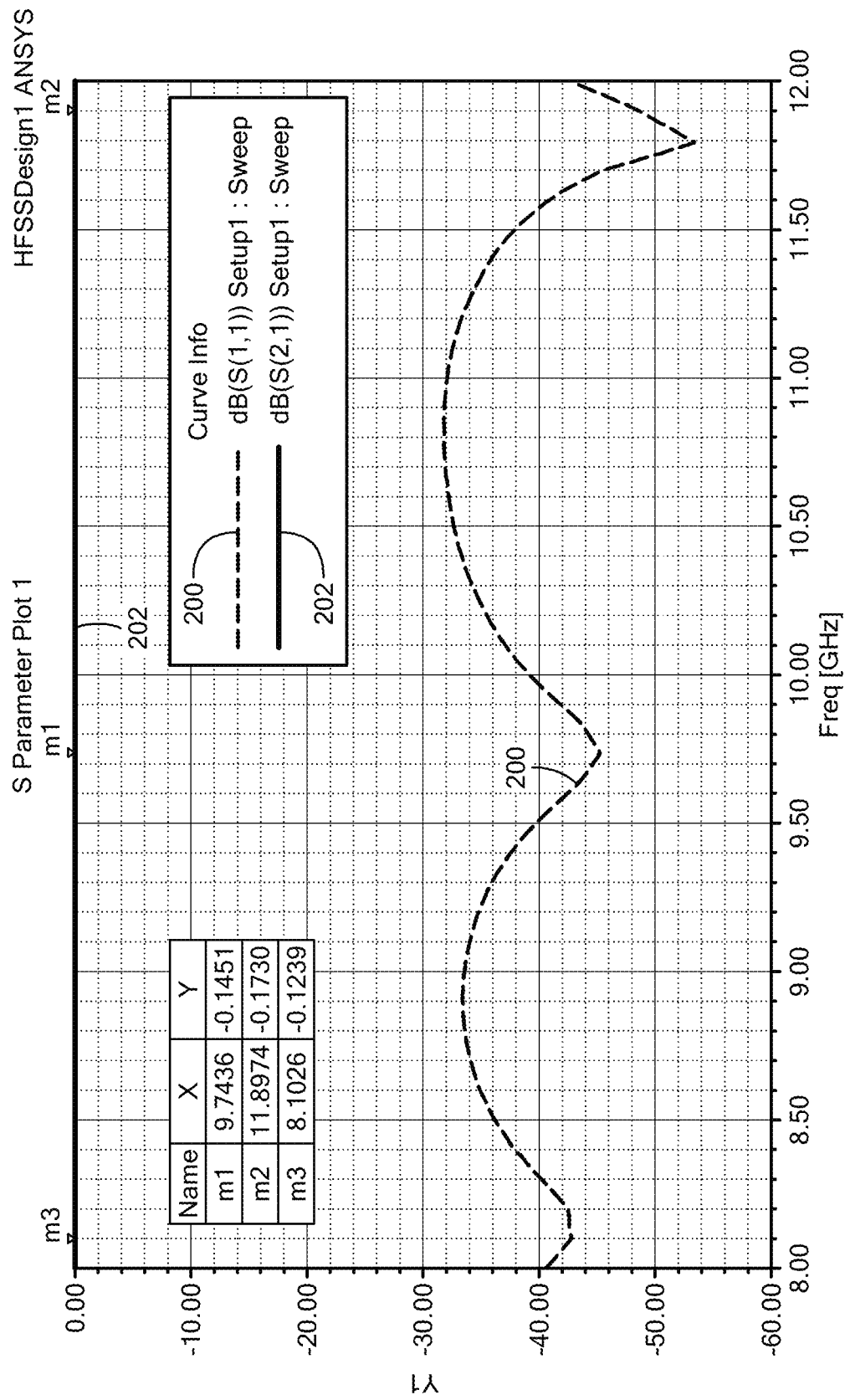
FIG. 2A is a graphical representation of S mode parameters for the housing assembly of FIG. 1A.
Figure 2B:
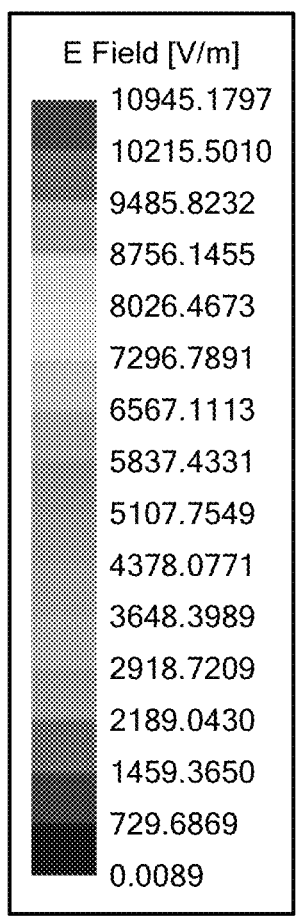
FIG. 2B is a graphical representation of the E-field for the housing assembly of FIG. 1A.
Figure 2B:
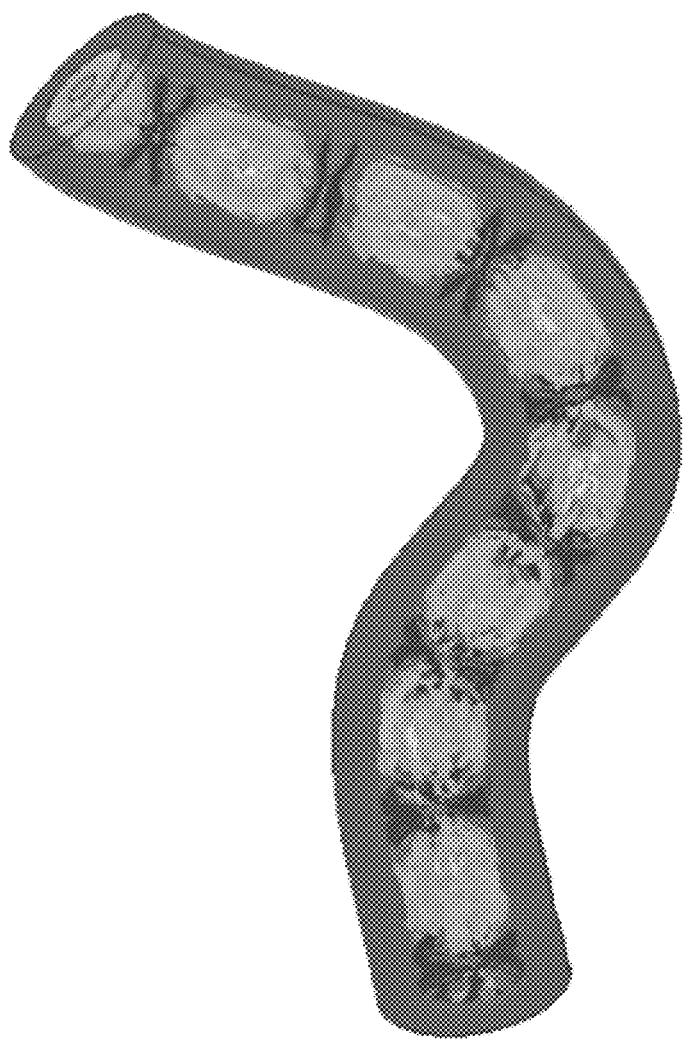

FIG. 2A shows an example S parameter plot over frequency for modes S(1,1) 200 and S(2,1) for the housing assembly of FIG. 1A. FIG. 2B shows an example graphical E-field display for an example channel, such as the conductor 104, dielectric 106, hemispherical housing 108 configuration of FIG. 1A.

Figure 3:
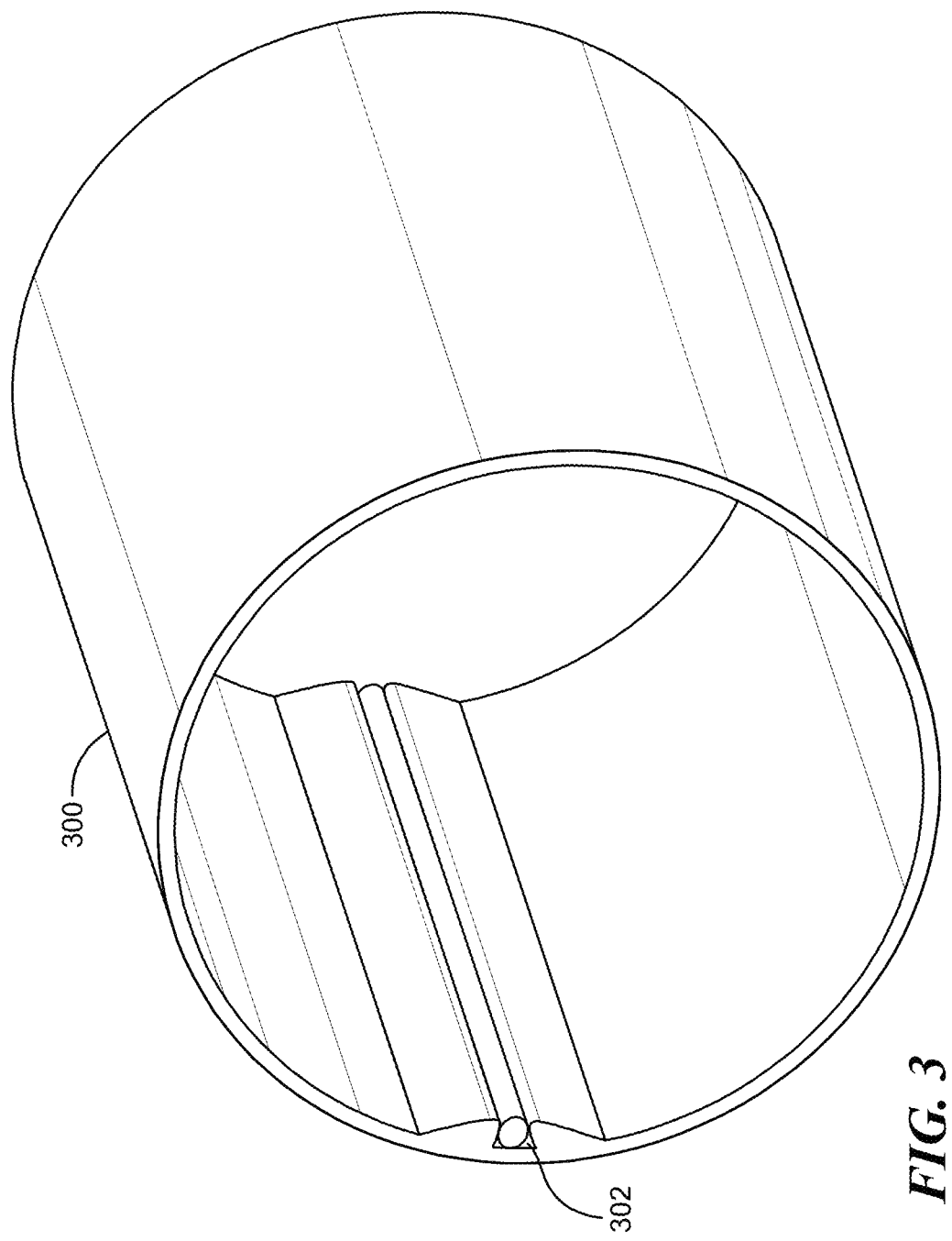
FIG. 3 is an isometric view of a conductive cylindrical housing having a groove for a cable.

FIG. 3 shows an example conductive housing 300 that is cylindrical in shape. The housing 300 includes a groove 302 along a length of the housing that is configured to contain a conductor and dielectric material. The groove 302 allows a cable to be routed on an interior surface of the conductive housing 300. It is understood that the groove 302 can have any suitable geometry, location, size, etc., to contain a particular conductor and dielectric configuration to form a channel having selected characteristics.

Figure 4A:
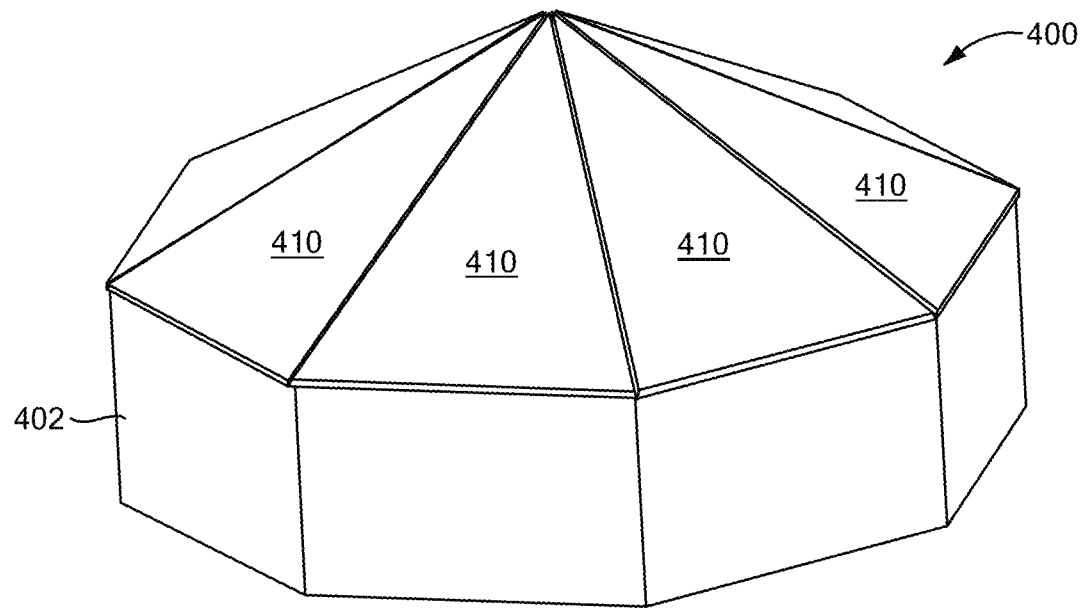
FIG. 4A is an isometric view.
Figure 4B:
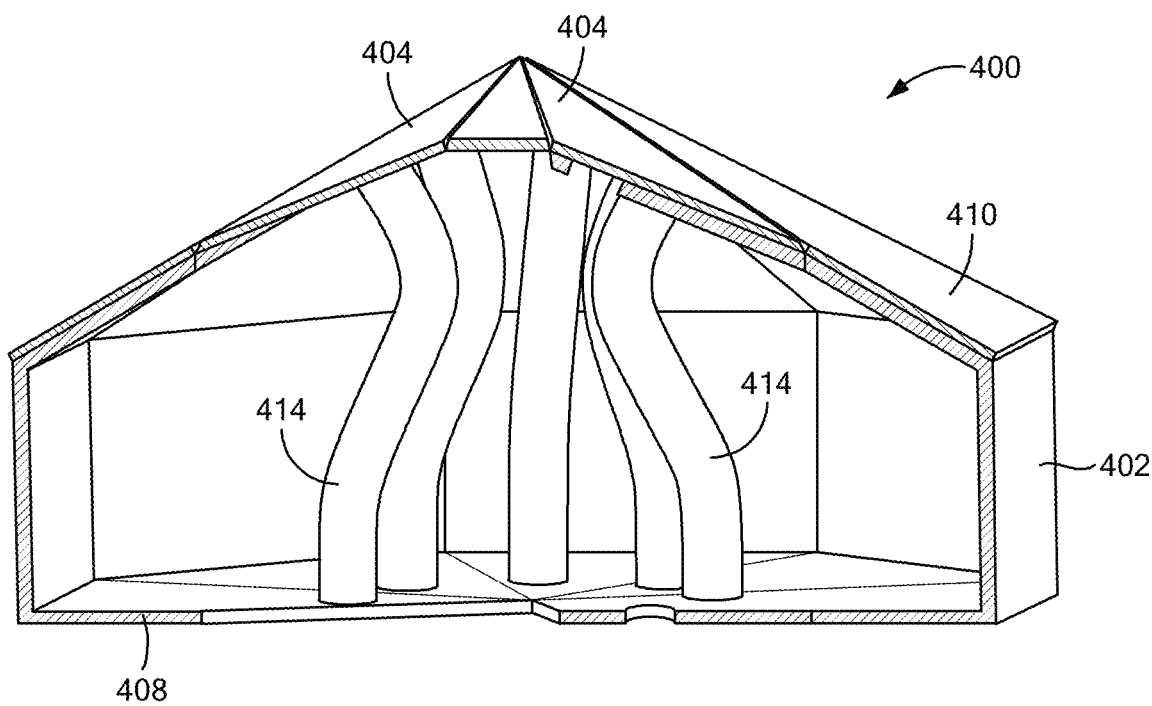
FIG. 4B is a cross-sectional view.
Figure 4C:
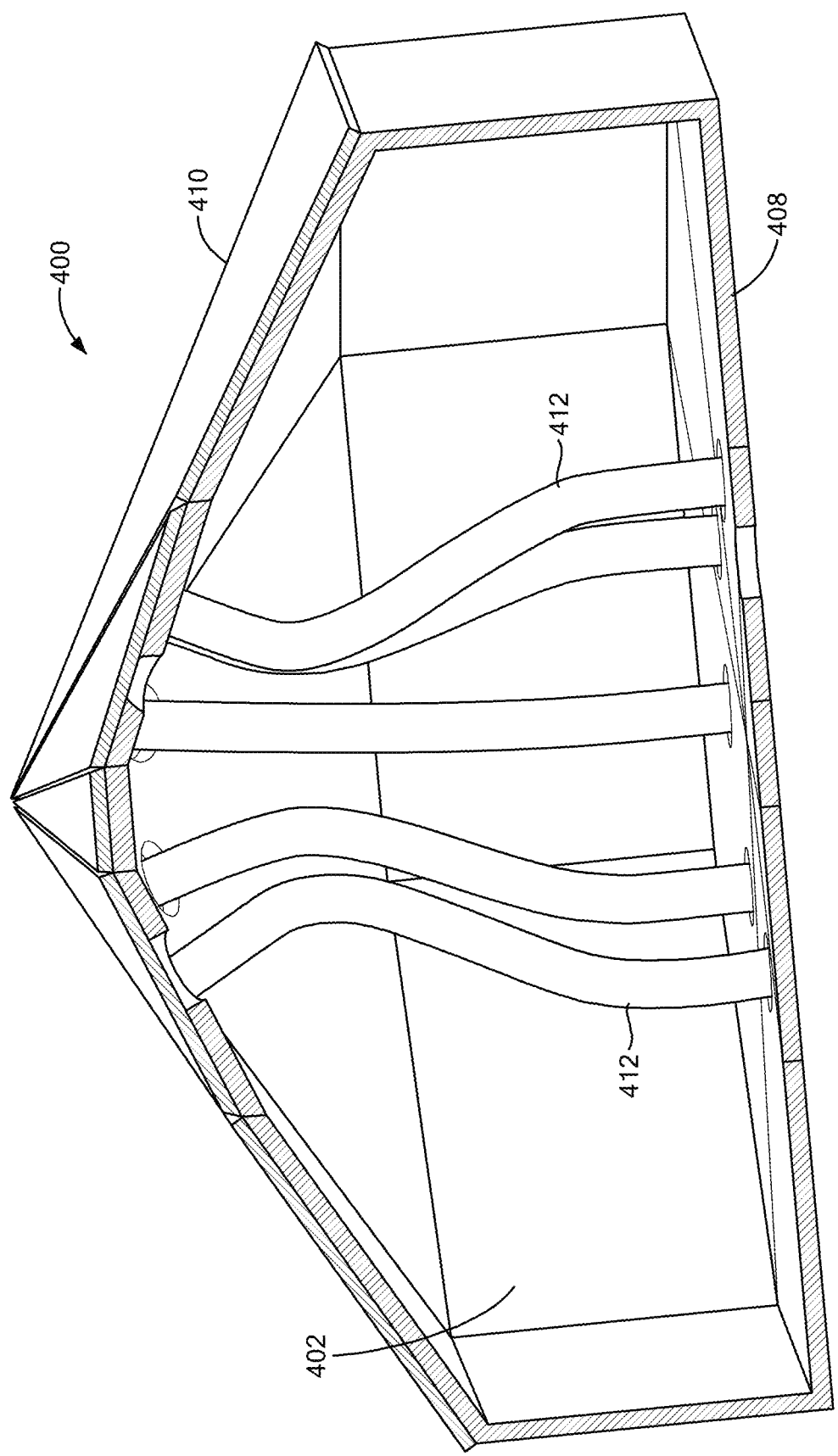
FIG. 4C is a cross-sectional view with certain features removed, of a housing assembly having integrated channels.

FIG. 4A is an isometric view of a housing assembly 400 having integrated cables, FIG. 4B is an isometric cross-sectional view of the housing assembly 400 of FIG. 4A, and FIG. 4C is an isometric cross-sectional view of the housing assembly of FIG. 4B without an outer conductor for the cables provided by the conductive housing.

In the illustrated embodiment, a housing 402 includes a top with eight facets 404 and a bottom surface 408. Respective circuit card assemblies (CCAs) 410 are mounted on each of the facets 404. A further CCA (not shown) can be mounted to the bottom surface 408 of the housing.

At least some of the CCAs 410 are interconnected to a circuit board on the bottom surface 408 of the housing. In the illustrated embodiment, respective channels include a cable (not shown) surrounded by dielectric material 412 and a shield 414 provided by the same material as the conductive housing 402.

In embodiments, the housing 402 can be 3D printed using a conductive material to form the facets 404, sides 416, and outer conductor/cable shields 414 for the channels. The channels can carry large numbers of high frequency signals for an antenna array, for example. In some embodiments, the array can comprise a conformal array. The cables can be inserted and/or embedded in the housing to reduce or eliminate mis-wired connections and facilitate assembly.

Figure 5:
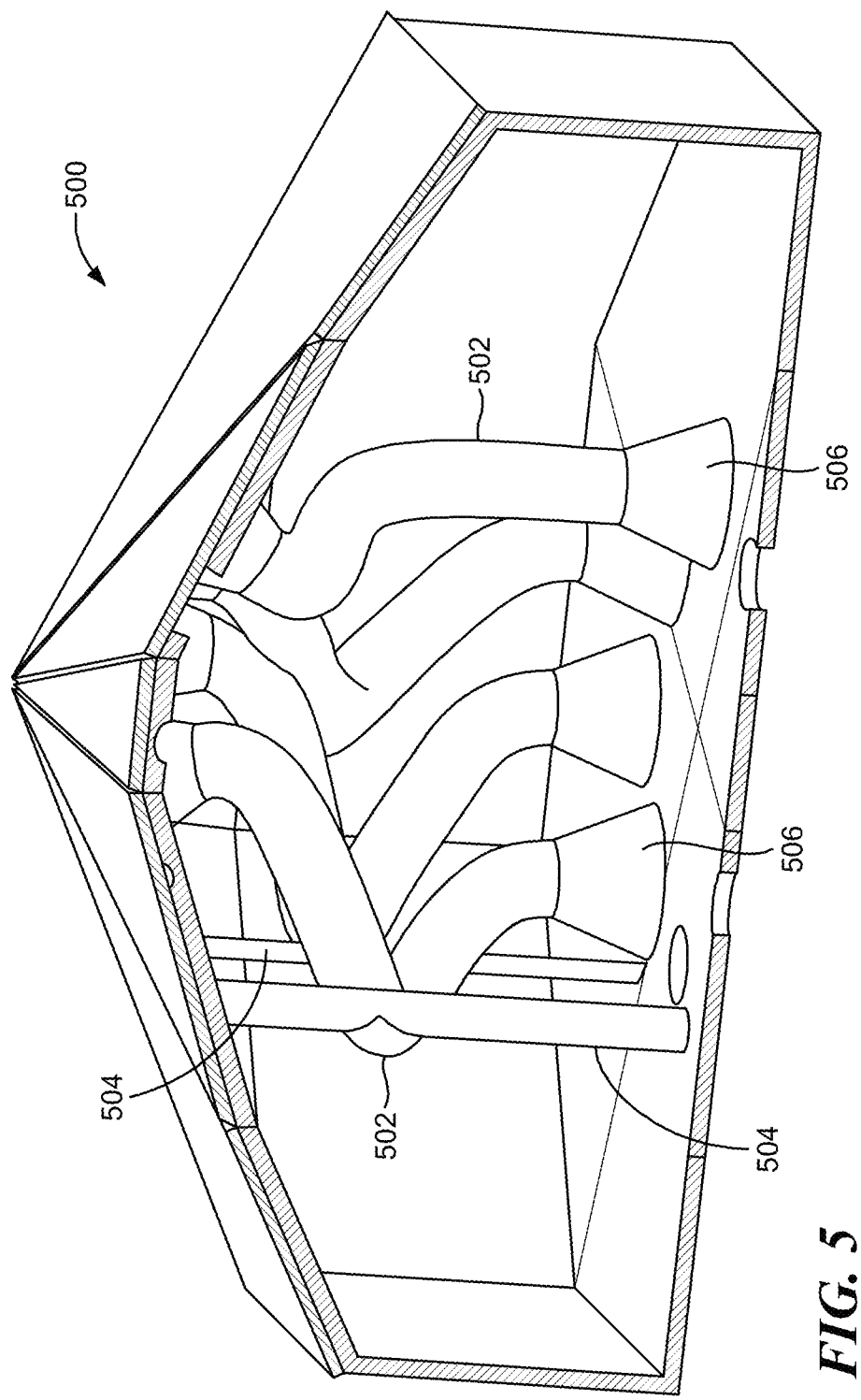
FIG. 5 is a cutaway isometric view of a housing assembly having integrated cables and structural members.

FIG. 5 shows a housing assembly 500 having integrated channels 502 shaped and configured to match phase and loss so as to provide improved performance compared to conventional cable configurations. The channels 502 can have lengths and shapes for optimization of a desired performance characteristics.

The channel walls, which can comprise the same conductive material as the housing, provide a thermal interface to the rest of the system. In some embodiments, structural members 504 can increase structural support and thermal performance.

It is understood that any practical number of support members in any suitable geometry can be used to achieve desired structural, thermal, and/or electrical performance characteristics. For example, in the illustrated embodiment, channels 502 can be flared 506 at one or both ends.

Figure 6A:
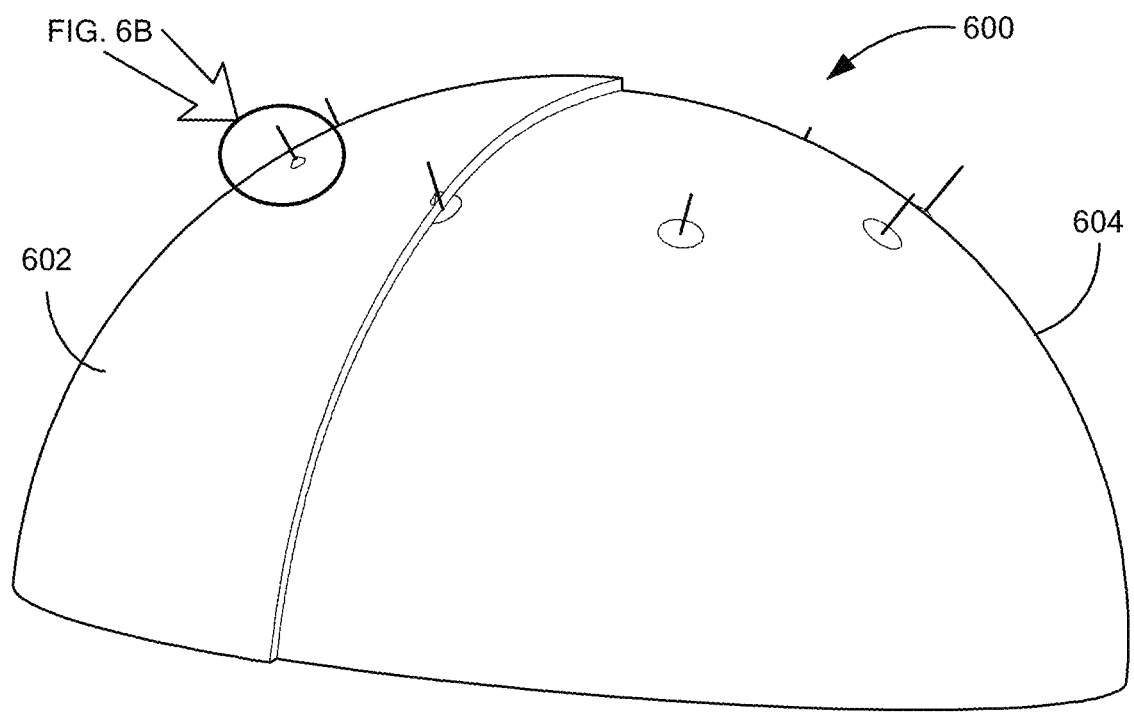
FIG. 6A is an isometric view of a housing assembly having integrated cables interconnected to a circuit board and FIG. 6B shows further details of the connection of the cables to the circuit board.
Figure 6B:
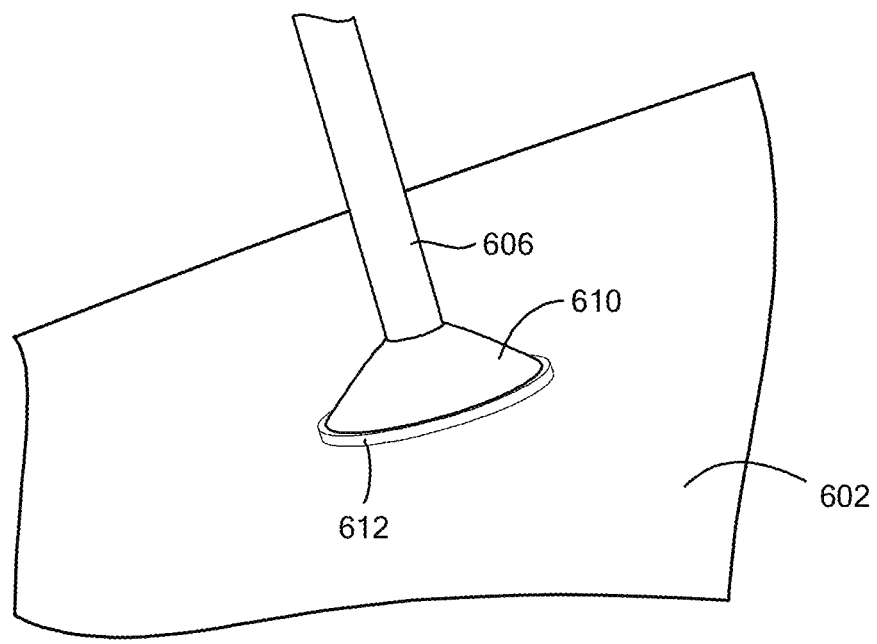

FIG. 6A is an isometric view of a housing assembly 600 having integrated cables that can provide an interface to a circuit board 602, such as a printed wiring board. FIG. 6B shows further detail of the interface to the circuit board.

In the illustrated embodiment, a printed wiring board (PWB) 602 is conformally mounted to a hemispherical housing 604. As described above, a conductor 606 surrounded by dielectric material 608 can go through the housing 604. The conductor 606 can extend up from the surface of the housing. In embodiments, the conductor 606 is used as a through hole solder interface to the PWB 602.

As best shown in FIG. 6B, a portion of the conductor 606 extends through the PWB 602. A solder fillet 610 and solder via pad 612 provide a connection to the PWB 602. With this arrangement, a circuit cards can be installed on housings with wires soldered in through holes in the circuit boards.

It is understood that embodiments of an assembly having integrated cables is applicable to wide variety of applications in which highly integrated electromechanical assemblies are desirable, such as radar antenna feed lines, computer network connections, digital audio, streaming configurations, cellular network connections, vehicle and the like.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A housing assembly, comprising:
   a housing comprising a conductive material;
   a conductor extending through the housing; and
   a dielectric material at least partially surrounding the conductor, wherein portions of the housing surround the conductor such that the conductor, the dielectric, and the portions of the housing form a channel through the housing,
   wherein a path of the conductor through the housing is non-linear and selected to achieve a selected length for the conductor.

2. The assembly according to claim 1, wherein the first channel comprises a coaxial transmission line.

3. The assembly according to claim 1, wherein the housing is printed.

4. The assembly according to claim 1, wherein the housing forms part of a conformal antenna array.

5. The assembly according to claim 4, further including a circuit board conformally mounted on the housing.

6. The assembly according to claim 1, wherein the housing has a hemispherical shape.

7. The assembly according to claim 1, wherein the housing has a cylindrical shape.

8. The assembly according to claim 1, wherein the housing is grounded.

9. The assembly according to claim 1, wherein the housing provides a thermal dissipation path.

10. The assembly according to claim 1, wherein the housing further includes a structural member to increase thermal performance of the assembly.

11. The assembly according to claim 1, wherein the housing further includes a structural member to increase structural strength of the housing.

12. The assembly according to claim 1, wherein an end of the conductor provides a through hole soldered interface to a circuit board.

13. A housing assembly, comprising:
    a housing comprising a conductive material;
    a conductor extending through the housing; and
    a dielectric material at least partially surrounding the conductor, wherein portions of the housing surround the conductor such that the conductor, the dielectric, and the portions of the housing form a channel through the housing,
    wherein a path of the conductor through the housing is non-linear and selected for phase performance.

14. A housing assembly, comprising:
    a housing comprising a conductive material;
    a conductor extending through the housing; and
    a dielectric material at least partially surrounding the conductor, wherein portions of the housing surround the conductor such that the conductor, the dielectric, and the portions of the housing form a channel through the housing,
    wherein a path of the conductor through the housing is non-linear and selected for loss performance.

15. A housing assembly, comprising:
    a housing comprising a conductive material;
    a conductor extending through the housing; and
    a dielectric material at least partially surrounding the conductor, wherein portions of the housing surround the conductor such that the conductor, the dielectric, and the portions of the housing form a channel through the housing,
    wherein the housing comprises a surface with a series of facets, respective circuit cards mounted on the facets, and respective channels are connected to the circuit cards.

16. A method, comprising:
    employing a housing comprising a conductive material;
    employing a conductor extending through the housing; and
    employing a dielectric material at least partially surrounding the conductor, wherein portions of the housing surround the conductor such that the conductor, the dielectric, and the portions of the housing form a channel through the housing,
    wherein a path of the conductor through the housing is non-linear and selected to achieve a selected length for the conductor.

17. The method according to claim 16, wherein the housing is printed.

18. The method according to claim 16, wherein the housing forms part of a conformal antenna array.

19. The method according to claim 18, further including employing a circuit board conformally mounted on the housing.

20. A method, comprising:
    employing a housing comprising a conductive material;
    employing a conductor extending through the housing; and
    employing a dielectric material at least partially surrounding the conductor, wherein portions of the housing surround the conductor such that the conductor, the dielectric, and the portions of the housing form a channel through the housing, wherein a path of the conductor through the housing is non-linear and selected for phase performance.

21. A method, comprising:

employing a housing comprising a conductive material;

employing a conductor extending through the housing; and employing a dielectric material at least partially surrounding the conductor, wherein portions of the housing surround the conductor such that the conductor, the dielectric, and the portions of the housing form a channel through the housing, wherein a path of the conductor through the housing is non-linear and selected for loss performance.

22. A method, comprising:

employing a housing comprising a conductive material;

employing a conductor extending through the housing; and employing a dielectric material at least partially surrounding the conductor, wherein portions of the housing surround the conductor such that the conductor, the dielectric, and the portions of the housing form a channel through the housing, wherein the housing comprises a surface with a series of facets, respective circuit cards mounted on the facets, and respective channels are connected to the circuit cards.

* * * * *